(12) United States Patent
Chien et al.

(10) Patent No.: US 6,327,682 B1
(45) Date of Patent: Dec. 4, 2001

(54) WAFER BURN-IN DESIGN FOR DRAM AND FERAM DEVICES

(75) Inventors: Pien Chien, Taipei; Jin-Yuan Lee, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/274,001

(22) Filed: Mar. 22, 1999

(51) Int. Cl.[7] .................................................. G11C 29/00
(52) U.S. Cl. ........................................ 714/718; 365/189.11
(58) Field of Search .............................. 714/718; 365/201, 365/145, 189.11

(56) References Cited

U.S. PATENT DOCUMENTS

| | | | |
|---|---|---|---|
| 5,155,701 | 10/1992 | Komori et al. | 365/185.23 |
| 5,282,167 * | 1/1994 | Tanaka et al. | 365/206 |
| 5,317,532 * | 5/1994 | Ochii | 365/149 |
| 5,357,193 | 10/1994 | Tanaka et al. | 324/158.1 |
| 5,467,356 | 11/1995 | Choi | 714/718 |
| 5,590,079 * | 12/1996 | Lee et al. | 365/201 |
| 5,638,331 * | 6/1997 | Cha et al. | 365/201 |
| 5,657,282 | 8/1997 | Lee | 365/201 |
| 5,790,465 * | 8/1998 | Roh et al. | 365/201 |
| 5,852,581 * | 12/1998 | Beffa et al. | 365/201 |
| 5,936,899 * | 8/1999 | Jeong | 365/201 |
| 6,026,038 * | 2/2000 | Cho et al. | 365/201 |
| 6,037,792 * | 3/2000 | McClure | 324/760 |

OTHER PUBLICATIONS

Tohru et al., Wafer Burn In (WBI) Technology for RAM's, IEEE, p. 639–642, 1993.*

* cited by examiner

Primary Examiner—Albert Decady
Assistant Examiner—Shelly A Chase
(74) Attorney, Agent, or Firm—George O. Saile; Stephen B. Ackerman

(57) ABSTRACT

In this invention is disclosed a method of burn-in testing either DRAM's or FeRAM's at the wafer level. A stress voltage is applied across all storage capacitors of a DRAM or a FeRAM during a wafer level burn-in test to weed out memory chips with weak memory cells. Three pads are added to the memory chips to accommodate a burn-in signal, a word line voltage and a stress voltage. The burn-in signal disables normal memory operations, powers on all word lines, and connects a stress voltage across the storage capacitors of the memory cells. The stress voltage across the storage capacitors is the difference between the externally applied stress voltage and a low voltage from the bit lines that is connected to the memory cells by means of the word lines. The wafer level burn-in provides a way to improve throughput by eliminating weak product early in the manufacturing process.

10 Claims, 3 Drawing Sheets

WAFER BURN-IN DESIGN FOR DRAM AND FERAM DEVICES

BACKGROUND OF THE INVENTION

1. Field of Invention

Figure 1:
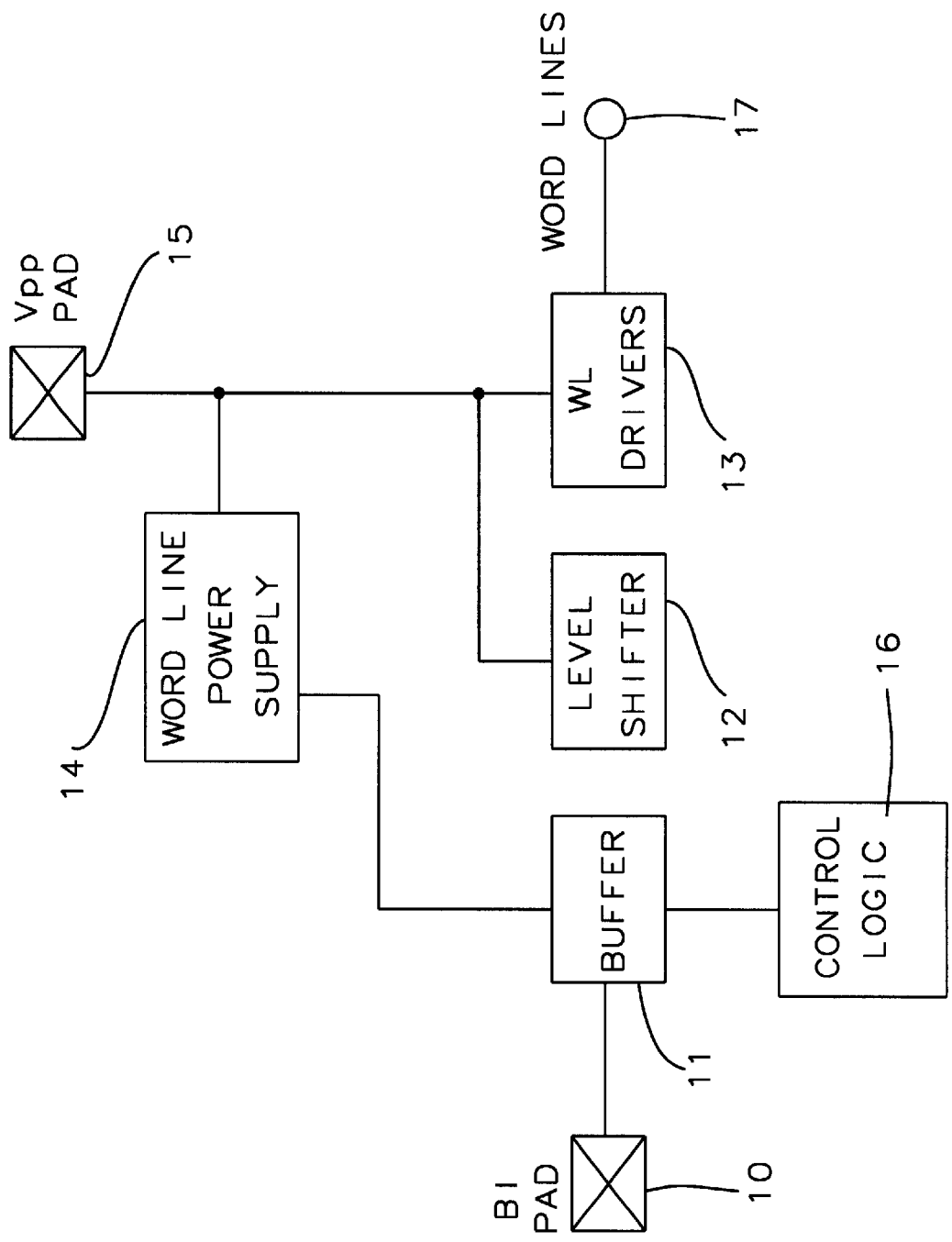

This invention relates in general to semiconductor memories and in particular to burn-in testing of DRAM (dynamic random access memory) and FeRAM (ferroelectric random access memory) memory chips.

2. Description of Related Art

With the increased density and complexity of semiconductor devices, the elements of the circuitry are becoming increasingly smaller and more prone to defects. Smaller sized defects are increasingly more important as semiconductor device elements become smaller. The use of burn-in testing to sort out devices with defects is important for detecting defective units, and a mainstay of semiconductor memory processing.

In U.S. Pat. No. 5,657,282 (Lee) a stress circuit and a method of applying a stress voltage is described. During test a first and second stress voltage is applied to physically adjacent word lines, and the state of a selected memory cell is sensed. In U.S. Pat. No. 5,467,356 (Choi) a burn-in enable circuit and a burn-in test method is shown. A high external voltage exceeding the external power voltage is applied to a semiconductor memory device that is detected by a burn-in enable circuit and causes a high stress voltage to be applied to all access transistors during burn-in. In U.S. Pat. No. 5,357,193 (Tanaka et al.) is described a memory device with a high voltage stress applying circuit and which reduces the number of test pads required on the memory chip. In U.S. Pat. No. 5,155,701 (Komori et al.) a method is described for testing inferior data retention of a defective EPROM memory cell.

In DRAM testing as with other high density semiconductor devices, improving the throughput of the semiconductor process is important to reducing manufacturing cost. Being able to screen out defective chips early in the process reduces the load on additional required process steps. Detecting defective memory chips at the wafer level provides a means by which the throughput of the manufacturing process can be improve.

SUMMARY OF THE INVENTION

In this invention a burn-in test stress voltage is applied across the storage capacitors in the memory cells of a DRAM or a FeRAM. Although, this burn-in could be applied at the package level, it is applied at the wafer level to allow the detection of weak bits and to allow screening out chips before wafer sorting and chip packaging. This reduces the number of devices processed in subsequent process steps and improves the process throughput of the memory chip.

Three probe pads are added to the memory chip, a burn-in (BI) control pad, a Vpp voltage pad to connect a voltage to the wordline drivers with sufficient power to power on all word lines simultaneously, and a Vcs pad that applies a stress voltage to one side of the storage capacitors of the memory cells. When a memory chip on a wafer is probed and a BI control signal is applied, all word lines are turned on, the reference voltage that is applied to the cell plate during normal operation is disconnected from the storage capacitors of the memory cells, and the memory chip circuitry such as refresh, addressing, read and write circuitry are disabled and put into a static state. The BI control signal turns on a pull down transistor connected to each bit line of the memory chip. The pull down transistors connects each bit line to circuit ground, and when the word lines are activated, the pull down transistor permits a low voltage to be applied to the cell side of the storage capacitor of the memory cells.

The word lines are activated by the burn-in control signal and a Vpp voltage applied to the Vpp pad on the memory chip is used to power the word lines. The Vpp voltage replaces the word line power supply and powers the word line drivers to turn on all word lines which allows the low voltage on the bit lines from the pull down transistors to be connected to the cell side of the storage capacitors. A stress voltage is connected to the reference side of the storage capacitors by a stress voltage applied to the Vcs pad on the memory chip. A switch controlled by the burn-in control signal disconnects a reference voltage used in normal operations from the reference side of the storage capacitor to allow a stress voltage connected to the Vcs pad to be applied to the reference side of the storage capacitors.

During burn-in testing of a DRAM or a FeRAM at the wafer level using the methods of this invention, all word lines are turned on, all bit lines are connected to circuit ground by means of the pull down transistors which in turn connects a low voltage to the cell side of all storage capacitors, and the reference side of each capacitor is connected to an applied external stress voltage. Thus the storage capacitor is stressed to a voltage that is the difference of the stress voltage and the low voltage from the bit lines. This burn-in testing screens out most weak bits before wafer sorting and chip packaging, and improves memory chip throughput by reducing the number of chips that will be tested bad in subsequent test steps in the manufacturing process to produce good memory chips including DRAM and FeRAM product.

Figure 2:
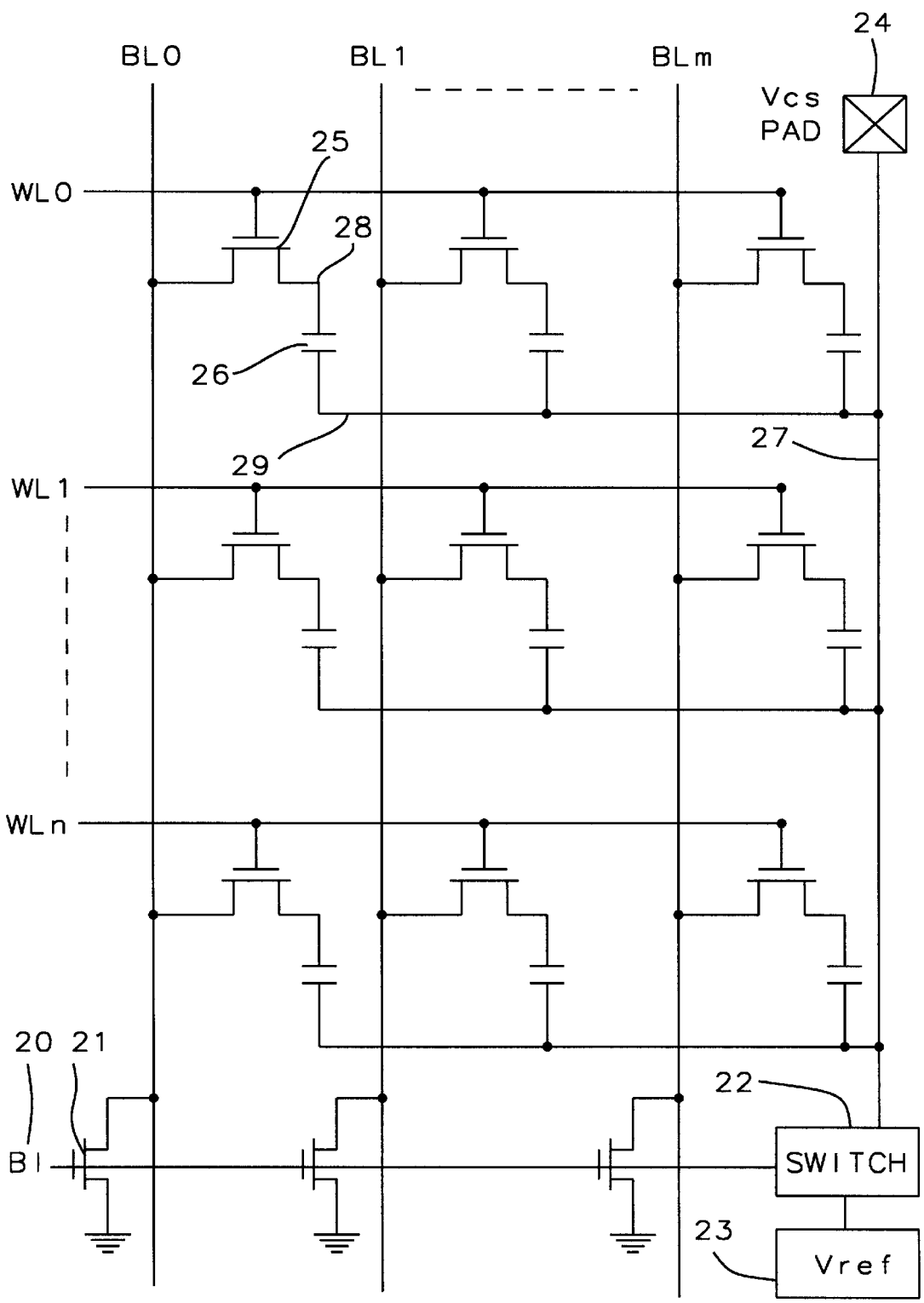
Figure 3:
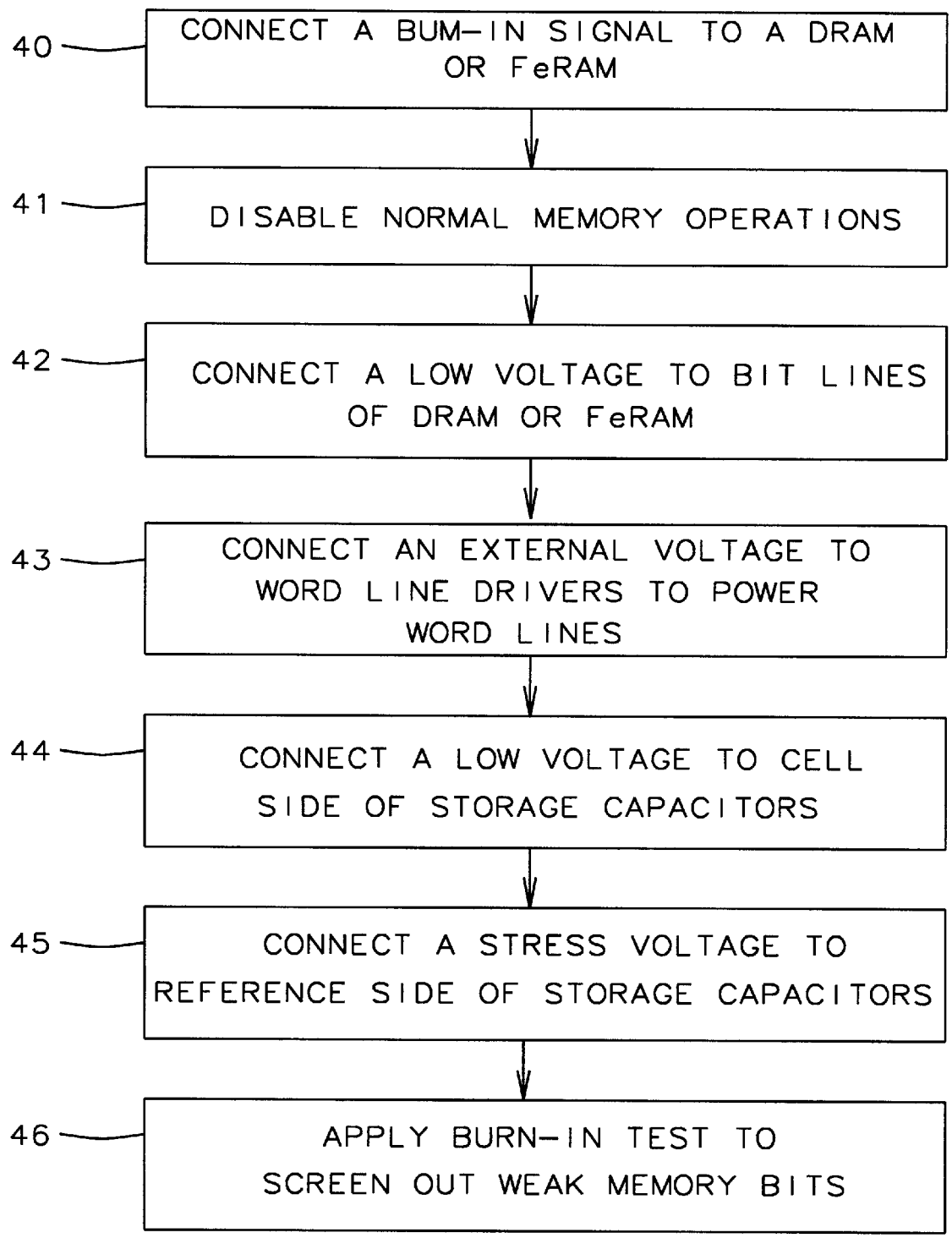

This invention will be described with reference to the accompanying drawings, wherein:

FIG. 1 shows a block diagram for connecting a burn-in test signal and a test voltage to word line drivers, FIG. 2 shows a schematic diagram of a DRAM or FeRAM memory array with voltages connected to the storage capacitors during burn-in testing, and FIG. 3 shows a method to apply a stress voltage to the storage capacitors of a DRAM or FeRAM memory during burn-in testing.

DETAILED DESCRIPTION OF THE PREFERRED EMBODIMENT

In FIG. 1 is shown a block diagram of circuitry connected to a burn-in BI pad 10 and an external voltage Vpp pad 15. A burn-in signal connected to the BI pad is connected to a buffer circuit 11. The output of the buffer circuit 11 is connected to a level shifter 12, memory control logic 16 and a word line power supply 14. When a burn-in signal is present on the BI pad 10, the buffer circuit 11 controls the word line power supply 14 off and acquiesces other memory control logic 16 to be static so as to not interfere with the burn-in testing. The output of the buffer circuit 11 drives a level shifter 12. The level shifter 12 is necessary to allow a low voltage logic signal from the buffer circuit 11 to drive the word line drivers 13 operating at a higher voltage level. The external voltage connected to the Vpp pad 15 is necessary to replace the word line power supply 14 to provide enough power to drive all word lines 17 simultaneously during the burn-in test.

Referring to FIG. 2, a memory array is shown with word lines WL0 to WLn and bit lines BL0 to BLm. A number of memory cells, represented by transistor 25 and storage capacitor 26, are shown connected between the word lines WL0 to Wln, the bit lines BL0 to Blm and the Referring to FIG. 2, a memory array is shown with word lines WL0 to WLn and bit lines BL0 to BLm. A number of memory cells, represented by transistor 25 and storage capacitor 26, are shown connected between the word lines WL0 to Wln, the bit lines BL0 to Blm and the storage capacitor reference line 27. When a burn-in signal is applied to the DRAM, the voltage on BI 20 goes high connecting the bit lines BL0 to BLm to a low voltage through the pull down transistors, represented by transistor 21, which are connected to circuit ground. At the same time the voltage on BI 20 controls switch 22 to disconnect Vref 23 from reference line 27 and the storage capacitors represented by capacitor 26. A stress voltage applied to the Vcs pad 24 is connected to the reference line 27 and the reference side 29 of the storage capacitors 26. The word lines WL0 to WLn are driven high by the word line drivers 13 as a result of the external voltage applied to the Vpp pad 15. When the word lines WL0 to WLn are activated by being driven high by the word line drivers 13, the low voltage on the bit lines BL0 to BLm is connected to the cell side 28 of the storage capacitors 26. Thus a voltage is applied across the storage capacitors 26 during burn-in is the difference between the low voltage on the cell side 28 of the capacitors and the external stress voltage from the Vcs pad 24 applied to reference side 29 of the capacitors. Similarly, both a DRAM and a FeRAM can be connected and stressed to perform a burn-in test of the storage cell, and that which is a reference line to a DRAM cell is a drive line to a FeRAM cell.

Referring to FIG. 3, a flow diagram is shown for the method of burn-in of the storage capacitors of a memory chip. Although, this method can be applied at the package level, it is intended to be used at the wafer level to weed out memory chips with weak memory cells, resulting in improved throughput of memory chips in the manufacturing process. A burn-in signal is connected to a memory chip 40. The Burn-in signal disables normal memory operations 41 comprising of disconnecting the word line power supply, disconnecting the storage capacitor reference voltage and preventing logic toggling by such operations as refresh for a DRAM. A low voltage is connected to all bit lines 42 by turning on a pull down transistor connected to each bit lines under the control of the burn-in signal. A positive external voltage is connected to power the word lines through the word line drivers 43. A low voltage is connected to the cell side of all storage capacitors 44 by the positive word line voltage resulting from the externally applied voltage connected to the word line drivers. An external stress voltage is connected to the reference side of all storage capacitors 45 resulting in a voltage across the storage capacitors being the difference between the external stress voltage and the low voltage from the bit lines. The burn-in test is applied to the memory chip for a period of time to screen out weak memory bits 46. The method described can be used for both DRAM's and FeRAM's similarly connected to burn-in test memory chips where the external stress voltage is applied to the reference line for a DRAM and the drive line for a FeRAM.

While the invention has been particularly shown and described with reference to preferred embodiments thereof it will be understood by those skilled in the art that various changes in form and details may be made without departing from the spirit and scope of the invention.

What is claimed is:

1. A circuit to burn-in DRAM (dynamic random access memory) and FeRAM (ferroelectric random access memory) storage cells, comprising:

a) a burn-in signal to condition DRAM or FeRAM circuitry for burn-in testing,
   b) a first externally applied voltage to power word lines,
   c) a second externally applied voltage to stress storage capacitors of said DRAM or said FeRAM, and
   d) a low voltage connected to bit lines through a pull down transistor by said burn-in signal and connected to storage cells by means of said word lines.

2. The circuit of claim 1, wherein a stress voltage across said storage capacitors is a result of said second applied voltage being connected to one side of said storage capacitor and said low voltage being connected to the other side of said storage capacitor.

3. The circuit of claim 1, wherein said burn-in signal controls said DRAM or said FeRAM to inhibit normal memory operations and connect a stress voltage across said storage capacitors.

4. The circuit of claim 1, wherein connections for said burn-in signal, said first externally applied voltage and said second externally applied voltage can be connected to at any package level including the wafer level for burn-in of said DRAM or said FeRAM.

5. A burn-in circuit for DRAM (dynamic random access memory) and FeRAM (ferroelectric random access memory) memories, comprising:

a) a burn-in signal connected to a DRAM or a FeRAM by means of a first signal pad,
   b) a first external voltage connected to word line drivers of said DRAM or said FeRAM by means of a second signal pad to power word lines,
   c) a second external voltage connected to reference side of storage capacitors of memory cells of said DRAM or said FeRAM by means of a third signal pad,
   d) said burn-in signal conditions said DRAM or said FeRAM for burn-in and connects a low voltage to bit lines through a pull down transistor,
   e) said low voltage connected to cell side of storage capacitors of said memory cells by means of powered word lines, and
   f) a stress voltage developed across said storage capacitors by a difference between said second external voltage and said low voltage.

6. The burn-in circuit of claim 5, wherein said burn-in signal and first and second external voltages are applied to DRAM or FeRAM signal pads at a wafer level during wafer burn-in to screen out weak memory bits.

7. A burn-in circuit for DRAM (dynamic random access memory) and FeRAM (ferroelectric random access memory) memories, comprising:

a) a burn-in signal connected to a DRAM or a FeRAM by means of a first signal pad,
   b) a first external voltage connected to word line drivers of said DRAM or said FeRAM by means of a second signal pad to power word lines,
   c) a second external voltage connected to reference side of storage capacitors of memory cells of said DRAM or said FeRAM by means of a third signal pad,
   d) said burn-in signal conditions said DRAM or said FeRAM for burn-in and connects bit lines to a low voltage through a pull down transistor,
   e) said low voltage connected to cell side of storage capacitors of said memory cells by means of powered word lines, and
   f) a stress voltage developed across said storage capacitors by a difference between said second external voltage and said low voltage.

8. A method to burn-in DRAM (dynamic random access memory) and FeRAM (ferroelectric random access memory) memory chips, comprising:

a) connecting a burn-in signal to a first external signal pad of a memory chip, b) disabling normal memory operation through control from said burn-in signal, c) connecting a low voltage to bit lines by means of pull down transistors under control of said burn-in signal, d) connecting a first external voltage to a second external signal pad of said memory chip to power wordlines, e) connecting said low voltage to a cell side of storage capacitors by means of powered wordlines, f) connecting a second external voltage to a third external signal pad of said memory chip to connect a stress voltage to a reference side of said storage capacitors, and g) applying burn-in test to screen out weak memory bits.

9. The method of claim 8, wherein disabling normal memory operations comprises disconnecting reference voltage from said storage capacitors, disabling wordline power supply and disabling refresh logic.

10. A method to burn-in DRAM (dynamic random access memory) and FeRAM (Ferroelectric random access memory) memory chips, comprising:

a) connecting a burn-in signal to a first external signal pad of a memory chip, b) disabling normal memory operation through control from said burn-in signal, c) connecting a low voltage to bit lines by means of pull down transistors connected to said bit lines and controlled by said burn-in signal, d) connecting a first external voltage to a second external signal pad of said memory chip to power wordlines, e) connecting said low voltage to a cell side of storage capacitors by means of powered wordlines, f) connecting a second external voltage to a third external signal pad of said memory chip to connect a stress voltage to a reference side of said storage capacitors, and g) applying burn-in test to screen out weak memory bits.

\* \* \* \* \*